United States Patent
Winslow

(10) Patent No.: US 7,049,893 B2
(45) Date of Patent: May 23, 2006

(54) APPARATUS, METHODS AND ARTICLES OF MANUFACTURE FOR POWER AMPLIFIER CONTROL IN A COMMUNICATION SYSTEM

(75) Inventor: Thomas Aaron Winslow, Salem, MA (US)

(73) Assignee: M/A-COM, Inc., Lowell, MA (US)

( * ) Notice: Subject to any disclaimer, the term of this patent is extended or adjusted under 35 U.S.C. 154(b) by 0 days.

(21) Appl. No.: 10/813,464

(22) Filed: Mar. 30, 2004

(65) Prior Publication Data
US 2004/0201421 A1 Oct. 14, 2004

Related U.S. Application Data

(60) Provisional application No. 60/462,791, filed on Apr. 14, 2003.

(51) Int. Cl.
*H03F 1/30* (2006.01)
(52) U.S. Cl. .................................. 330/290; 330/285
(58) Field of Classification Search ................ 330/285, 330/296, 289, 310, 311, 290
See application file for complete search history.

(56) References Cited

U.S. PATENT DOCUMENTS

| | | | |
|---|---|---|---|
| 5,629,648 A | 5/1997 | Pratt | 330/289 |
| 6,052,032 A * | 4/2000 | Jarvinen | 330/289 |
| 6,313,705 B1 * | 11/2001 | Dening et al. | 330/276 |
| 6,549,076 B1 * | 4/2003 | Kuriyama | 330/296 |
| 6,882,227 B1 * | 4/2005 | Barry et al. | 330/296 |
| 2002/0063601 A1 | 5/2002 | Yamamoto et al. | 330/289 |
| 2002/0097097 A1 | 7/2002 | Sugiura | 330/295 |

OTHER PUBLICATIONS

Noh Y S et al "Linearized InGaP/GaAs HBT MMIC power amplifier with active bias circuit" IEEE Radio and Wireless Conference Rawcon 2001, Aug. 19, 2001 pp. 249-252, XP010555678 Waltham, MA, USA.

* cited by examiner

*Primary Examiner*—Henry Choe

(57) ABSTRACT

An apparatus and method for amplifying a radiofrequency (RF) signal. The apparatus comprises a control circuit including a first transistor, a second transistor, and a ballast resistor coupled between an emitter terminal of the first transistor and a base terminal of the second transistor, such that a control voltage applied to a base terminal of the first transistor controls the amplification of a signal applied to the base terminal of the second transistor. Additional elements may be coupled to the control circuit to improve the performance thereof, including a feedback stabilization circuit, a diode stack circuit, a bypass capacitor and an additional resistor.

27 Claims, 7 Drawing Sheets

APPARATUS, METHODS AND ARTICLES OF MANUFACTURE FOR POWER AMPLIFIER CONTROL IN A COMMUNICATION SYSTEM

RELATED APPLICATIONS

The present application is based on, and claims priority of under 35 U.S.C. § 119(e), U.S. Provisional Application No. 60/462,791, filed Apr. 14, 2003.

FIELD OF THE INVENTION

This present invention relates generally to power amplifiers, and particularly to Hetero-Bipolar Transistor (HBT) power amplifier control.

BACKGROUND OF THE INVENTION

Single, dual, and quad-band power amplifier designs typically utilize various forms of 'emitter follower' configurations of HBT transistors for power and bias control. Examples of such control circuits may be found in U.S. Pat. No. 6,313,705 and U.S. Pat. No. 5,629,648.

However, emitter follower circuits such as these may demonstrate stability problems, particularly under high power drive. In particular, emitter follower based HBT control circuits are sensitive to oscillations that manifest near peak operating power due to the large changes in the capacitive loading and bias requirements of the power amplifier stage under control. This can cause inductive ringing at the collector of the transistor used for the bias control circuit. Suppressing oscillations is critical for amplifier performance.

An additional, but important aspect of the basic emitter follower type HBT control circuit is the amount of control current necessary to drive the control circuit, which sets the quiescent bias point of the power amplifier. At high operating power levels, RF power is amplified and propagated through a power amplifier (e.g., power amplifier 118 in FIG. 1), and is also incident on the base-emitter junction of a control circuit (e.g., the base-emitter junction of control transistor 108 in FIG. 1). The RF power incident on the emitter of the control circuit causes rectification and increases the amount of control current required for output power control of the power amplifier. Another problem with the basic emitter follower style control circuits is that the sharp power control slope (dB/V) inherent in these circuits can make the power amplifier difficult to control.

Accordingly, it would be helpful to the art of electromagnetic processing to provide more efficient and reliable power amplifier controls.

SUMMARY OF THE INVENTION

An exemplary embodiment of the present invention comprises a circuit including a first transistor, a second transistor, a ballast resistor coupled between an emitter terminal of the first transistor and a base terminal of the second transistor, and a feedback stabilization circuit coupled to the first transistor, wherein a control voltage applied to a base terminal of the first transistor controls the amplification of a signal applied to the base terminal of the second transistor.

An exemplary embodiment of the present invention also comprises a circuit including a first transistor, a second transistor, a ballast resistor coupled between an emitter terminal of the first transistor and a base terminal of the second transistor, and a diode stack circuit coupled to the first transistor, wherein a control voltage applied to a base terminal of the first transistor controls the amplification of a signal applied to the base terminal of the second transistor.

An exemplary embodiment of the present invention also comprises a circuit including a first transistor, a second transistor, a ballast resistor coupled between an emitter terminal of the first transistor and a base terminal of the second transistor, and at least one bypass capacitor coupled to a collector terminal of the first transistor, wherein a control voltage applied to a base terminal of the first transistor controls the amplification of a signal applied to the base terminal of the second transistor.

An exemplary embodiment of the present invention also comprises a circuit including a first transistor, a second transistor, a ballast resistor coupled between an emitter terminal of the first transistor and a base terminal of the second transistor, and at least one additional resistor coupled between the emitter terminal of the first transistor and a base terminal of the first transistor, wherein a control voltage applied to a base terminal of the first transistor controls the amplification of a signal applied to the base terminal of the second transistor.

An exemplary embodiment of the present invention also comprises a method for amplifying a signal, including the steps of providing a control signal to a base terminal of a first transistor, creating a bias voltage across a ballast resistor coupled to an emitter terminal of the first transistor, providing feedback stabilization of the control signal, and applying the bias voltage to the base terminal of a second transistor to change the amplification of a signal also applied to the base terminal of the second transistor.

An exemplary embodiment of the present invention also comprises a method for amplifying a signal, including the steps of providing a control signal to a base terminal of a first transistor, creating a bias voltage across a ballast resistor coupled to an emitter terminal of the first transistor, providing a circuit to compensate for temperature variations, and applying the bias voltage to the base terminal of a second transistor to change the amplification of a signal also applied to the base terminal of the second transistor.

An exemplary embodiment of the present invention also comprises a method for amplifying a signal, including the steps of providing a control signal to a base terminal of a first transistor, creating a bias voltage across a ballast resistor coupled to an emitter terminal of the first transistor, providing at least one bypass capacitor coupled to a collector terminal of the first transistor to improve peak operating performance, and applying the bias voltage to the base terminal of a second transistor to change the amplification of a signal also applied to the base terminal of the second transistor.

An exemplary embodiment of the present invention also comprises a method for amplifying a signal, including the steps of providing a control signal to a base terminal of a first transistor, creating a bias voltage across a ballast resistor coupled to an emitter terminal of the first transistor, providing at least one resistor coupled between the base terminal and the emitter terminal of the first transistor to reduce the power control waveform slope, and applying the bias voltage to the base terminal of a second transistor to change the amplification of a signal also applied to the base terminal of the second transistor.

DETAILED DESCRIPTION

One exemplary embodiment of the present invention includes apparatus, methods and articles of manufacture for a power amplifier control system. For illustration purposes, an exemplary embodiment basically comprises a Hetero-Bipolar Transistor (HBT) power amplifier and control circuit for controlling the power amplification of an RF communication signal. The amplification control system disclosed herein may be used, however, with a wide range of electromagnetic wave processing systems and is not limited to RF communication systems. The system may be used in a wide range of applications, such as, for example, receivers, transducers, and the like, and is not limited to transmitters.

The term "signal" as is used herein should be broadly construed to include any manner of conveying data from one place to another, such as, for example, an electric current or electromagnetic field, including without limitation, a direct current that is switched on and off or an alternating-current or electromagnetic carrier that contains one or more data streams. Data, for example, may be superimposed on a carrier current or wave by means of modulation, which may be accomplished in analog or digital form. The term "data" as used herein should also be broadly construed to comprise any type of intelligence or other information, such as, for example and without limitation, audio, such as voice, text and/or video, etc.

In the aforementioned HBT transistor exemplary embodiment, the invention advances the state of the art in amplifier design by improving the stability of an 'emitter follower' type control circuit for HBT power amplifiers, increasing the peak operating power of the amplifier, decreasing the amount of control current necessary to control the power amplifier, and improving (reducing) the amplifier's power control slope (dB/V).

In the exemplary embodiment of the control circuit, several elements may be added to the control circuit to improve the stability and performance of a power amplifier coupled thereto. These elements may include, for example, a linearizing capacitor across a two diode stack (See, elements 104, 114 in FIG. 1), which improves the control circuit stability under high power amplifier drive and helps to increase peak operating performance of the amplifier; an RC feedback circuit (See, element 106 in FIG. 1), which helps to improve stability by eliminating the voltage gain of the control circuit at low frequencies; an on-chip collector bypass capacitor (See, element 110 in FIG. 1), which helps to eliminate inductive ringing on the collector and also serves to improve peak operating performance of the amplifier; and additional resistance (See, element 112 in FIG. 1) across the base and collector terminals of a control transistor to help linearize (reduce) the power control slope of the power amplifier.

Figure 1:
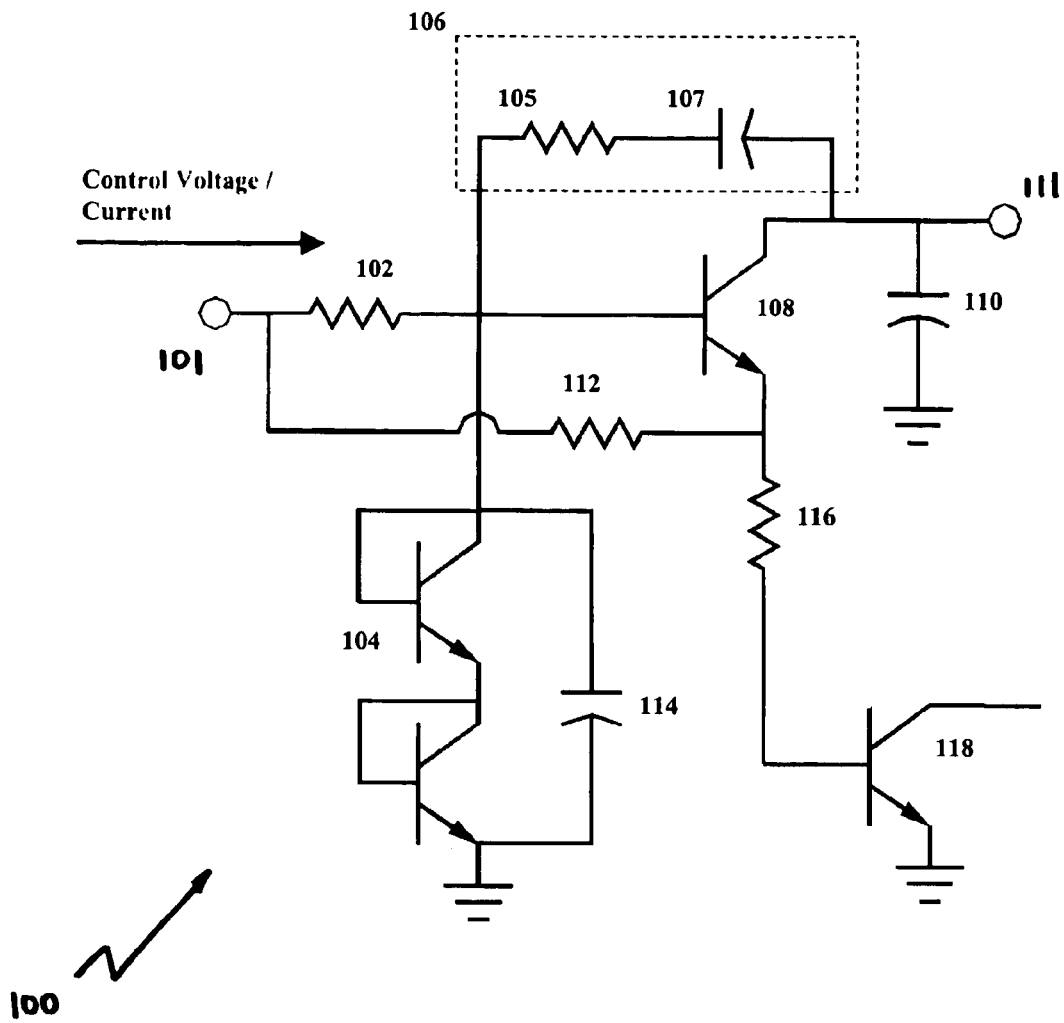
FIG. 1 shows a schematic diagram of a power amplification control circuit according to an exemplary embodiment of the present invention.

FIG. 1 illustrates one exemplary embodiment of a power amplification control circuit 100. In its most basic embodiment, the control circuit includes a first transistor 108 (hereinafter also referred to as a 'control' transistor due to the fact that it controls the operation of a second transistor 118), a second transistor 118 (hereinafter also referred to as an 'amplifier' transistor due to the fact that it amplifies a RF signal), a biasing resistor 102, and a ballast resistor 116. The first (control) transistor 108 may have its base terminal coupled to a first input node 101 through the biasing resistor 102. In the exemplary embodiment, first (control) transistor 108 may comprise an emitter-follower configured HBT transistor.

The second (amplifier) transistor 118 is preferably coupled to the emitter terminal of the first (control) transistor 108 through the ballast resistor 116. The collector terminal of the first (control) transistor 108 is coupled to a feedback stabilization circuit 106 which is, in turn, coupled to third and fourth transistors 104. The collector terminal of the first (control) transistor 108 is also coupled to a second input node 111. The second input node 111 is preferably coupled to a standard voltage source (e.g., $V_{cc}$), typically 3 to 5 Volts (V).

In operation, a power amplifier control signal (voltage or current) applied to the input node 101 biases the first (control) transistor 108 and determines the level of output power delivered by the second (amplifier) transistor 118. Particularly, the application of a control signal at the first input node 101 serves to create a voltage across biasing resistor 102, and also produces a control input to the base terminal of first (control) transistor 108. The control input applied to the base terminal of the first (control) transistor 108 biases the transistor ON, thus creating a voltage across ballast resistor 116. The voltage across ballast resistor 116 is consequently applied to the base terminal of the second (amplifier) transistor 118. The second (amplifier) transistor 118 is preferably coupled to an antenna port of a front end module of a receiver, which contains voice and/or data signals used for RF communication.

Variations in the control signal (e.g., the RF input signal applied to input node 101) controls the flow of current through the first (control) transistor 108, thus controlling the voltage across ballast resistor 116. The resulting varying control voltage across the ballast resistor 116 is input to the base terminal of the second (amplifier) transistor 118, which in turn controls the quiescent bias level of the second (amplifier) transistor 118.

In the exemplary embodiment, the second (amplifier) transistor 118 preferably comprises an HBT transistor for amplifying the power of an RF signal being transmitted to an antenna port of a front end receiver module. The RF power output from the second (amplifier) transistor 118 is thus controlled by: (1) the RF power incident on the base terminal of the second (amplifier) transistor 118 from another source (e.g., Voltage Controlled Oscillator (VCO), previous gain stage in a multistage power amplifier, etc.), and (2) the control voltage supplied to the second (amplifier) transistor 118 through the ballast resistor 116 (resulting from the application of the control signal at the first input node 101).

The control voltage applied through the ballast resistor 116 determines the quiescent bias level of the second (amplifier) transistor 118, which in turn determines the level of RF output power transmitted by second transistor 118 (into an antenna port of the front end receiver module). In this way, an input RF signal containing the voice/data information, such as an RF communication signal, may be amplified by the system and such amplification may be controlled.

In the exemplary embodiment, additional transistors (e.g., third and fourth transistors 104) may also be included as part of a 'diode stack' to compensate for temperature variations produced by the amplification process. A first bypass capacitor 114 may be placed across the diode stack (e.g., from the base terminal of the first transistor in the diode stack to the emitter terminal of the last transistor in the diode stack). The first bypass capacitor 114 may be selected to compensate for non-linearities that may occur in the amplified signal as the power level is increased due to limitations in the semiconductor materials from which the circuit is fabricated. Thus, the first bypass capacitor 114 helps to maintain linearity of the amplified signal at higher power amplification levels to stabilize system operation.

A feedback stabilization circuit 106 may also be included with the first (control) transistor 108 (which is used to control the second (amplifier) transistor 118) to enhance stability of the control circuit 100. The feedback stabilization circuit 106 may comprise, for example, a resistor 105 and a capacitor 107, which may be connected in series from the collector of the first (control) transistor 108 to its base. This configuration helps to reduce the voltage gain of the control circuit at low frequencies relative to the transmit and receive bands of the front end receiver module.

A second bypass capacitor 110 may also be included to improve peak operating performance of the control circuit 100. Second bypass capacitor 110 may be provided on-chip with first transistor 108, and connected to the collector thereof. The second bypass capacitor 110 in this configuration reduces undesired high frequency oscillations in the control signal provided to the base terminal of the second (amplifier) transistor 118, which is caused by inductive ringing on the collector of first (control) transistor 108 in the absence of the second bypass capacitor 110.

Finally, an additional resistor 112 may be placed across the base (external to the bias resistor 102) and emitter of first (control) transistor 108 in the control circuit 100. Additional resistor 112 reduces the power control slope of the power amplifier control circuit 100, thus improving the linearity of the power amplification of the system at varying signal levels.

It will be understood by those of ordinary skill in the art that the diode stack transistors 104, first bypass capacitor 114, feedback stabilization circuit 106, second bypass capacitor 110, and additional resistor 112 are not required for proper operation of the above-described control circuit 100. These elements are optional, and provide additional benefits as explained in detail below with reference to FIGS. 3–7.

Figure 2:
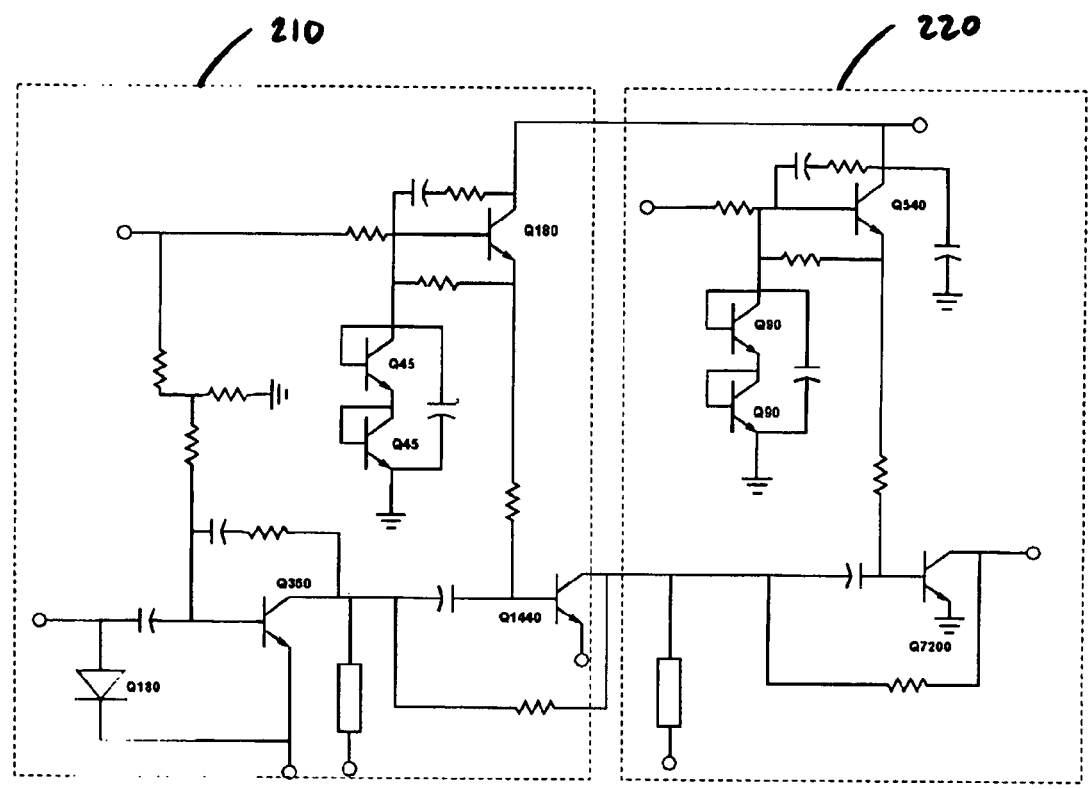
FIG. 2 shows a schematic diagram of a power amplifier circuit incorporating the control circuit of FIG. 1.
Figure 3:
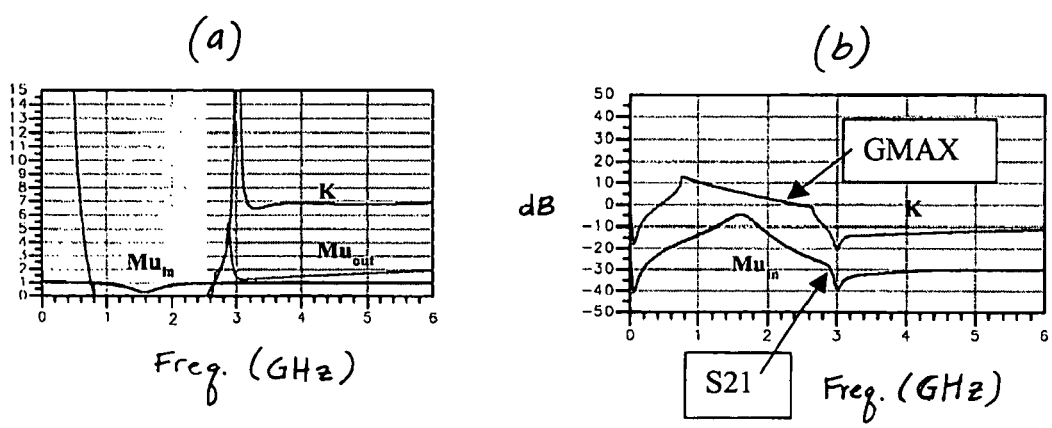
FIG. 3(a) is a graph showing stability factors, K, $Mu_{in}$, and $Mu_{out}$, versus frequency for a power amplification control circuit according to a first exemplary embodiment.
FIG. 3(b) is a graph showing gain parameters S21 and Gmax (in decibels) versus frequency for a power amplification control circuit according to the first exemplary embodiment.
Figure 4:
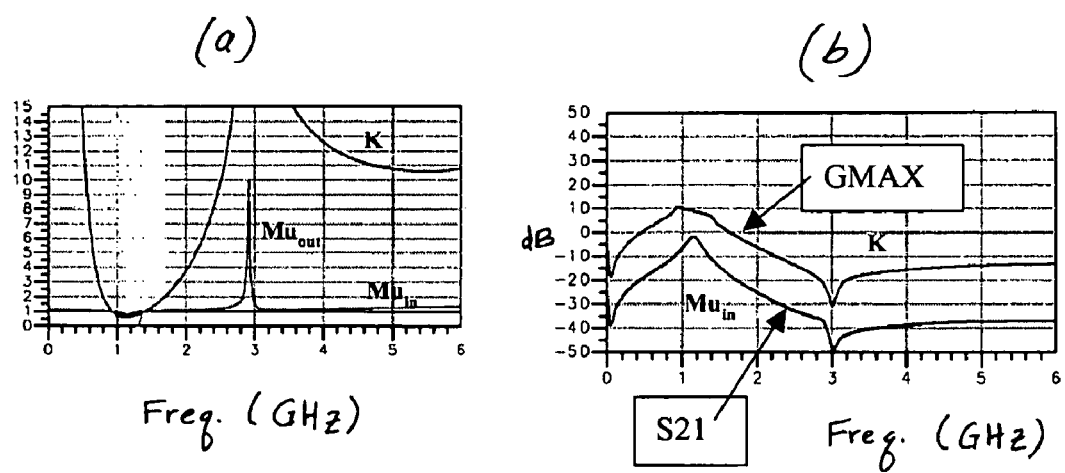
FIG. 4(a) is a graph showing stability factors, K, $Mu_{in}$, and $Mu_{out}$, versus frequency for a power amplification control circuit according to a second exemplary embodiment.
FIG. 4(b) is a graph showing gain parameters S21 and Gmax (in decibels) versus frequency for a power amplification control circuit according to the second exemplary embodiment.
Figure 5:
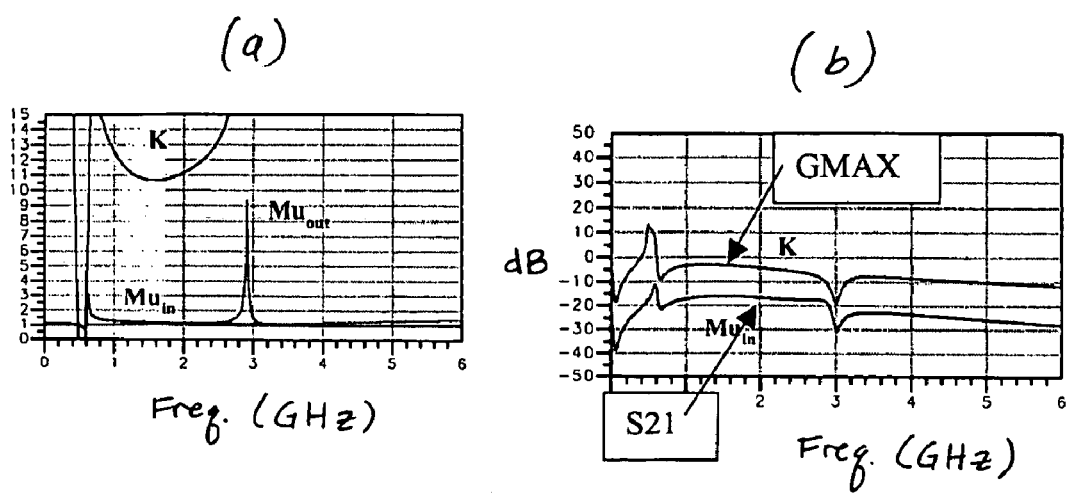
FIG. 5(a) is a graph showing stability factors, K, $Mu_{in}$, and $Mu_{out}$, versus frequency for a power amplification control circuit according to a third exemplary embodiment.
FIG. 5(b) is a graph showing gain parameters S21 and Gmax (in decibels) versus frequency for a power amplification control circuit according to the third exemplary embodiment.
Figure 6:
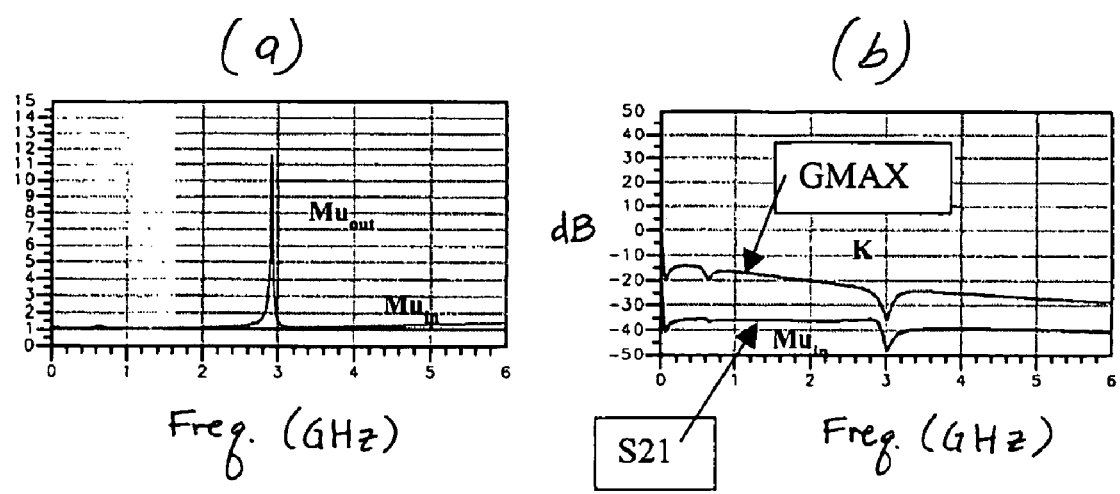
FIG. 6(a) is a graph showing stability factors, K, $Mu_{in}$, and $Mu_{out}$, versus frequency for a power amplification control circuit according to a fourth exemplary embodiment.
FIG. 6(b) is a graph showing gain parameters S21 and Gmax (in decibels) versus frequency for a power amplification control circuit according to the fourth exemplary embodiment.
Figure 7:
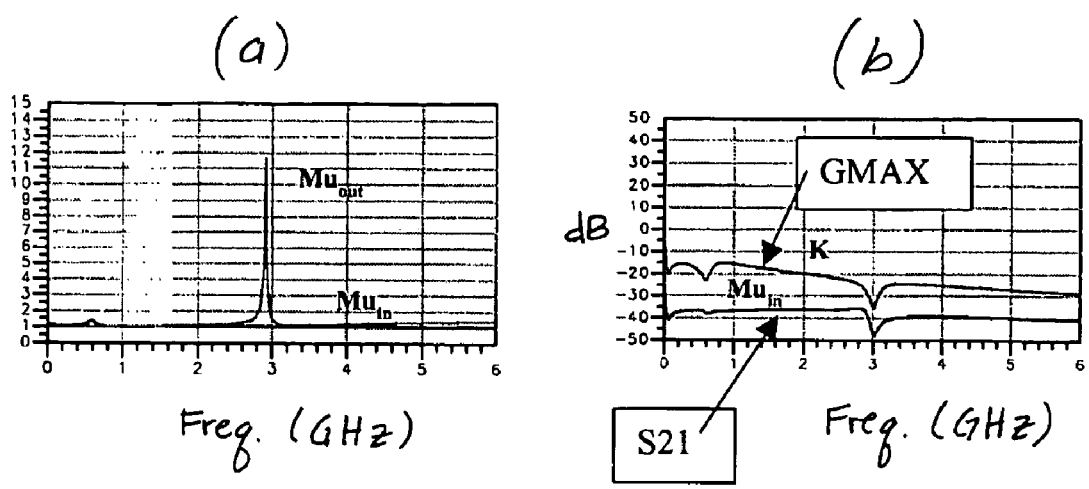
FIG. 7(a) is a graph showing stability factors, K, $Mu_{in}$, and $Mu_{out}$, versus frequency for a power amplification control circuit according to a fifth exemplary embodiment.
FIG. 7(b) is a graph showing gain parameters S21 and Gmax (in decibels) versus frequency for a power amplification control circuit according to the fifth exemplary embodiment.

FIG. 2 illustrates a power amplifier circuit 200 incorporating the aforementioned power amplifier control circuit 100. As shown in FIG. 2, a pre-amplification stage 210 may be used to process a control signal (e.g., the control signal provided at first input node 101 for biasing the first (control) transistor 108 in the control circuit 100), which is output from the amplification stage 220. Pre-amplification stage 210 may comprise any number of circuit configurations, well known to those of ordinary skill in the art, such as the transistor and biasing component configuration shown in FIG. 2. Those of ordinary skill in the art will appreciate that the specific values of biasing components shown for the pre-amplification stage 210 are for purposes of illustration only and that the invention is not limited thereto.

It will be noted that the amplification stage 220 of the power amplifier circuit 200 includes the basic elements of the control circuit 100 described above with reference to FIG. 1. In particular, transistors Q540 and Q7200 comprise the first (control) and second (amplifier) transistors 108, 118 of the control circuit 100. Further, transistors Q90 comprises the third and fourth transistors 104 of the diode stack. Those of ordinary skill in the art will appreciate that the specific values of biasing components shown for the amplification stage 220 are for purposes of illustration only and that the invention is not limited thereto.

FIGS. 3–7 are charts illustrating simulated performance of various exemplary embodiments of the control circuit 100 of the present invention. First through fourth exemplary embodiments are identified by reference numerals, 100', 100", 100''', and 100'''', respectively. In all of these examples, the simulations were conducted with a 4700 picofarad (pF) surface mountable external bypassing capacitor (not shown in FIGS. 1–2) on the first input node 101 of the control circuit 100. In addition, the control circuit 100 is current and capacitive loaded so that it is biased active in a way similar to the conditions it would see under high power operation within the power amplifier circuit 200 of FIG. 2. The limited stability and excessive gain of the control circuit 100 makes it susceptible to amplifying undesired spurious signals (coupled from the RF power amplifier circuit 200), and noise (from control circuitry which is external to the power amplifier circuit 200, designed to control the power amplifier power levels), and then to feed these spurious signals and noise directly back to the power amplifier circuit 200.

The coupling of undesired spurious signals and noise may be improved by controlling the gain of the control circuit 100 itself, which is defined by a simulated parameter "S21," and an associated gain parameter "Gmax." The greater the RF and high frequency gain (i.e., S21 and Gmax) of the control circuit 100, the more unstable the control circuit may be, and thus cause the associated power amplifier circuit 200, to be unstable and to generate and amplify undesirable spurious signals. Described below with reference to FIGS. 3–7 are various biasing arrangements for the control circuit 100 which serve to control the gain parameters S21 and Gmax, and thus limit the generation and amplification of spurious signals by the associated power amplifier circuit 200.

In the graphs shown in FIGS. 3(a) and 3(b), the biasing resistor 102' of the control circuit 100' was set at 80 Ohms ($\Omega$). In addition, no feedback stabilization circuit 106, diode stack capacitor 114, or second bypass capacitor 110 were used. As can be seen from FIGS. 3(a) and 3(b), the exemplary control circuit 100' exhibited minimal stability and insufficient base resistance, as noted by the stability factor, K and stability measures $Mu_{in}$ and $Mu_{out}$ becoming negative at certain frequencies. Since the stability measures, K, $Mu_{in}$, and $Mu_{out}$ are calculated from S-parameters of a circuit with active gain, they provide a useful measure of the susceptibility of the control circuit 100 to receiving and amplifying undesired spurious signals and noise and then feeding these signals and noise to the power amplifier circuit 200.

In the graphs shown in FIGS. 4(a) and 4(b), biasing resistor 102' was set to 280$\Omega$. Additionally, no feedback stabilization circuit 106, diode stack bypass capacitor 114, or second bypass capacitor 110 were used. As with the previous example (e.g., 100'), the circuit 100" exhibited improved, but still insufficient, stability under load.

In the graphs shown in FIGS. 5(a) and 5(b), biasing resistor 102" was again set to 280$\Omega$. Also, no feedback stabilization circuit 106, or diode stack bypass capacitor 114, were used. In this exemplary control circuit 100", a second bypass capacitor 110" was included, and was set to 22 pF. The presence of the second bypass capacitor 110" reduces inductive ringing across the collector of first (control) transistor 108", but introduces a low frequency region where the stability factor, K, of the control circuit 100" becomes negative which indicates a potential unstable operating situation. FIGS. 5(a) and 5(b) also illustrate that the frequency response of the control circuit 100" is tunable due to the bond wire or trace inductance present in the collector bias line, between the first (control) transistor 108", and the second bypass capacitor 110 when the system is fabricated in an integrated circuit (IC).

In the graphs shown in FIGS. 6(a) and 6(b), biasing resistor 102''' was set to 280$\Omega$. The exemplary control circuit 100''' included no feedback stabilization circuit 106. However, the control circuit 100''' did include a diode stack bypass capacitor 114 which was set to 14 pF. The control circuit 100''' also included a second bypass capacitor 110 which was set to 22 pF. As can be seen from FIGS. 6(a) and 6(b), adding a diode stack bypass capacitor 114 significantly reduced the voltage gain of the control circuit 100''', and improves the stability factor of the control circuit across a broad frequency range.

In the graphs shown in FIGS. 7(a) and 7(b), biasing resistor 102'''' was set to 280$\Omega$. A diode stack bypass capacitor 114 was set to 14 pF, and a second bypass capacitor 110 was set to 22 pF. A feedback stabilization circuit 106 was also added, which included a 90 $\Omega$ resistor in series with a 2 pF capacitor. As can be seen from FIGS. 7(a) and 7(b), the resulting embodiment significantly reduced the gain of the control circuit 100'''', and improved the overall stability of the control circuit (and power amplifier) under operating conditions similar to those seen within a saturated power amplifier.

Having thus described a few particular embodiments of the invention, various alterations, modifications, and improvements will readily occur to those skilled in the art. Such alterations, modifications and improvements as are made obvious by this disclosure are intended to be part of this description though not expressly stated herein, and are intended to be within the spirit and scope of the invention.

One of ordinary skill in the art will accordingly appreciate that embodiments of the invention or various components and/or features thereof may be entirely comprised of hardware, software and/or may be a combination of software and hardware. Accordingly each of the blocks of the drawings, and combinations of blocks of the drawings, may be embodied in many different ways, as is well known to those of skill in the art. Thus, the foregoing description is by way of example only, and not limiting. The invention is limited only as defined in the following claims and equivalents thereto.

Although the invention has been described in terms of exemplary embodiments, it is not limited thereto. Rather, the appended claims should be construed broadly to include other variants and embodiments of the invention which may be made by those skilled in the art without departing from the scope and range of equivalents of the invention.

What is claimed is:

1. A circuit comprising:
   a first transistor;
   a second transistor;
   a ballast resistor coupled between an emitter terminal of the first transistor and a base terminal of the second transistor; and,
   a feedback stabilization circuit coupled to the first transistor,
   wherein a control voltage applied to a base terminal of the first transistor controls the amplification of a signal applied to the base terminal of the second transistor.

2. The circuit of claim 1, further comprising a biasing resistor coupled between a first input node and the base terminal of the first transistor.

3. A circuit comprising:
   a first transistor;
   a second transistor;
   a ballast resistor coupled between an emitter terminal of the first transistor and a base terminal of the second transistor; and,
   a feedback stabilization circuit coupled to the first transistor,
   wherein a control voltage applied to a base terminal of the first transistor controls the amplification of a signal applied to the base terminal of the second transistor, and
   wherein said feedback stabilization circuit includes at least one capacitor and at least one resistor.

4. The circuit of claim 1, further comprising a diode stack circuit coupled to the first transistor, said diode stack circuit including at least two transistors.

5. The circuit of claim 4, further comprising at least one bypass capacitor coupled to the at least two transistors.

6. The circuit of claim 1, further comprising at least one bypass capacitor coupled to the first transistor.

7. The circuit of claim 1, further comprising at least one additional resistor coupled between the emitter terminal of the first transistor and a base terminal of the first transistor.

8. A circuit comprising:
   a first transistor;
   a second transistor;
   a ballast resistor coupled between an emitter terminal of the first transistor and a base terminal of the second transistor; and,
   a diode stack circuit coupled to the first transistors, wherein a control voltage applied to a base terminal of the first transistor controls the amplification of a signal applied to the base terminal of the second transistor, and further comprising a feedback stabilization circuit, said feedback stabilization circuit including at least one capacitor and at least one resistor.

9. The circuit of claim 8, further comprising a biasing resistor coupled between a first input node and the base terminal of the first transistor.

10. The circuit of claim 8, wherein the diode stack circuit includes at least two transistors.

11. The circuit of claim 10, further comprising at least one bypass capacitor coupled to the at least two transistors.

12. The circuit of claim 8, further comprising at least one bypass capacitor coupled to the first transistor.

13. The circuit of claim 8, further comprising at least one additional resistor coupled between the emitter terminal of the first transistor and a base terminal of the first transistor.

14. A circuit comprising:
a first transistor;
a second transistor;
a ballast resistor coupled between an emitter terminal of the first transistor and a base terminal of the second transistor; and,
at least one bypass capacitor coupled to a collector terminal of the first transistor,
wherein a control voltage applied to a base terminal of the first transistor controls the amplification of a signal applied to the base terminal of the second transistor and
further comprising a feedback stabilization circuit, said feedback stabilization circuit including at least one capacitor and at least one resistor.

15. The circuit of claim 14, further comprising a biasing resistor coupled between a first input node and the base terminal of the first transistor.

16. The circuit of claim 14, further comprising a diode stack circuit, wherein the diode stack circuit includes at least two transistors.

17. The circuit of claim 16, further comprising at least one bypass capacitor coupled to the at least two transistors.

18. The circuit of claim 14, further comprising at least one additional resistor coupled between the emitter terminal of the first transistor and a base terminal of the first transistor.

19. A circuit comprising:
a first transistor;
a second transistor;
a ballast resistor coupled between an emitter terminal of the first transistor and a base terminal of the second transistor; and,
at least one additional resistor coupled between the emitter terminal of the first transistor and a base terminal of the first transistors,
wherein a control voltage applied to a base terminal of the first transistor controls the amplification of a signal applied to the base terminal of the second transistor and
further comprising a feedback stabilization circuit, wherein said feedback stabilization circuit includes at least one capacitor and at least one resistor.

20. The circuit of claim 19, further comprising a biasing resistor coupled between a first input node and the base terminal of the first transistor.

21. The circuit of claim 19, further comprising a diode stack circuit coupled to the first transistor, said diode stack circuit including at least two transistors.

22. The circuit of claim 21, further comprising at least one bypass capacitor coupled to the at least two transistors.

23. The circuit of claim 19, further comprising at least one bypass capacitor coupled to the first transistor.

24. A method for amplifying a signal, comprising the steps of:
providing a control signal to a base terminal of a first transistor;
creating a bias voltage across a ballast resistor coupled to an emitter terminal of the first transistor;
providing feedback stabilization of the control signal; and,
applying the bias voltage to the base terminal of a second transistor to change the amplification of a signal also applied to the base terminal of the second transistor.

25. A method for amplifying a signal, comprising the steps of:
providing a control signal to a base terminal of a first transistor;
creating a bias voltage across a ballast resistor coupled to an emitter terminal of the first transistor;
providing a circuit to compensate for temperature variations; and,
applying the bias voltage to the base terminal of a second transistor to change the amplification of a signal also applied to the base terminal of the second transistor.

26. A method for amplifying a signal, comprising the steps of:
providing a control signal to a base terminal of a first transistor;
creating a bias voltage across a ballast resistor coupled to an emitter terminal of the first transistor;
providing at least one bypass capacitor coupled to a collector terminal of the first transistor to improve peak operating performance; and,
applying the bias voltage to the base terminal of a second transistor to change the amplification of a signal also applied to the base terminal of the second transistor.

27. A method for amplifying a signal, comprising the steps of:
providing a control signal to a base terminal of a first transistor;
creating a bias voltage across a ballast resistor coupled to an emitter terminal of the first transistor;
providing at least one resistor coupled between the base terminal and the emitter terminal of the first transistor to reduce the power control waveform slope; and,
applying the bias voltage to the base terminal of a second transistor to change the amplification of a signal also applied to the base terminal of the second transistor.

* * * * *